United States Patent [19]
Feldtkeller

[11] Patent Number: 5,146,114
[45] Date of Patent: Sep. 8, 1992

[54] COMPARATOR CIRCUIT

[75] Inventor: Martin Feldtkeller, München, Fed. Rep. of Germany

[73] Assignee: Siemens Aktiengesellschaft, Munich, Fed. Rep. of Germany

[21] Appl. No.: 654,739

[22] Filed: Feb. 13, 1991

[30] Foreign Application Priority Data

Feb. 13, 1990 [EP] European Pat. Off. ........ 90102815.9

[51] Int. Cl.⁵ .............................................. H03K 5/24
[52] U.S. Cl. .................................... 307/355; 307/350; 307/362; 307/494
[58] Field of Search ............... 307/355, 350, 360, 362, 307/491, 494

[56] References Cited
U.S. PATENT DOCUMENTS

| | | | |
|---|---|---|---|
| 4,418,290 | 11/1983 | Nagano | 307/355 |
| 4,529,891 | 7/1985 | Oida | 307/355 |
| 4,542,303 | 9/1985 | Jarrett et al. | 307/350 |
| 4,580,069 | 4/1986 | Bynum | 307/350 |
| 4,634,897 | 1/1987 | Yoshioka | 307/359 |
| 4,724,339 | 2/1988 | Ishida | 307/355 X |
| 4,825,104 | 4/1989 | Yamakoshi et al. | 307/355 |

FOREIGN PATENT DOCUMENTS 0011525  1/1982  Japan .................................. 307/494

Primary Examiner—Eugene R. LaRoche
Assistant Examiner—Son Dinh
Attorney, Agent, or Firm—Herbert L. Lerner; Laurence A. Greenberg

[57] ABSTRACT

A comparator circuit includes first and second transistors of one conduction type having bases receiving input signals, collectors with leads being connected to a first pole of a supply voltage source, and coupled emitters. A resistor is connected into the collector lead of one of the first and second transistors of the one conduction type. A transistor of another conduction type has a base-to-emitter path connected parallel to the resistor and a collector issuing an output signal. A current impressing device is connected between the coupled emitters of the first and second transistors of the one conduction type and a second pole of the supply voltage source. The current impressing device impresses a current at every operating temperature being equal to twice the quotient of the base-to-emitter voltage of the transistor of the other conduction type and the resistor.

4 Claims, 1 Drawing Sheet

COMPARATOR CIRCUIT

The invention relates to a comparator circuit.

In analog integrated circuits, comparators are often used to compare two voltages to one another. The outcome of the comparison is indicated at the output of the comparator by a specific switching state.

As will be explained in greater detail in the description of the drawings, a current mirror is typically used as a load in comparator circuits. One conventional comparator circuit is, for instance, known as the LP265/LP365 Micropower Programmable Quad Comparator, from pages 4-67 ff in the Linear Databook I of National Semiconductor Corporation, Santa Clara, Calif. When several comparators are needed in an integrated circuit, a current mirror, with its two transistors, represents a considerable expenditure for circuitry.

It is accordingly an object of the invention to provide a comparator circuit, which overcomes the hereinafore-mentioned disadvantages of the heretofore-known devices of this general type and is less expensive.

With the foregoing and other objects in view there is provided, in accordance with the invention, a comparator circuit, comprising first and second transistors of one conduction type having bases receiving input signals, collectors with leads being connected to a first pole of a supply voltage source, and coupled emitters; a resistor connected into the collector lead of one of the first and second transistors of the one conduction type; a transistor of another conduction type having a base-to-emitter path connected parallel to the resistor and a collector issuing an output signal; and current impressing means connected between the coupled emitters of the first and second transistors of the one conduction type and a second pole of the supply voltage source, the current impressing means impressing a current at every operating temperature being equal to twice the quotient of the base-to-emitter voltage of the transistor of the other conduction type and the resistor.

In accordance with another feature of the invention, the resistor is a first resistor, the transistor of the other conduction type is a first transistor of the other conduction type, and there is provided a second resistor having the same resistance and the same temperature response as the first resistor and being connected into the collector lead of the other of the first and second transistors of the one conduction type; and a second transistor of the other conduction type having the same base-to-emitter voltage and the same temperature response as the first transistor of the other conduction type, having a base-to-emitter path connected parallel to the second resistor, and having a collector issuing another output signal.

In accordance with a further feature of the invention, the current impressing means are in the form of a third transistor of the one conduction type having an emitter connected to the second pole of the supply voltage, a collector connected to the coupled emitters of the first and second transistors of the one conduction type, and a base; and there is provided a diode connected in the conducting direction between the base of the third transistor of the one conduction type and the second pole of the supply voltage source; a third transistor of the other conduction type having a base and having a collector-to-emitter path connected to the base of the third transistor of the one conduction type, and a third resistor connected between the collector-to-emitter path of the third transistor of the other conduction type and the first pole of the supply voltage source; a fourth resistor connected between the base of the third transistor of the other conduction type and the second pole of the supply voltage source, and a fourth transistor of the other conduction type having a collector-to-emitter path connected between the base of the third transistor of the other conduction type and the first pole of the supply voltage source; the fourth transistor of the other conduction type having a base-to-emitter path connected parallel to the fourth resistor.

In accordance with a concomitant feature of the invention, there are provided additional transistors of the one conduction type having base-to-emitter paths connected parallel to the base-to-emitter path of the third transistor of the one conduction type, the additional transistors providing current impressing means for further comparator circuits.

Other features which are considered as characteristic for the invention are set forth in the appended claims.

Although the invention is illustrated and described herein as embodied in a comparator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
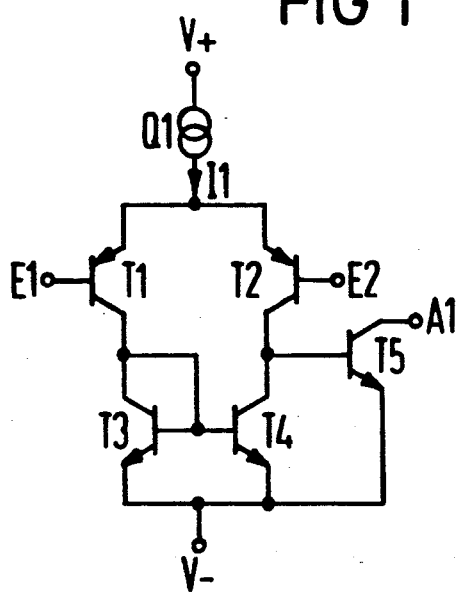
FIG. 1 is a schematic circuit diagram of a known comparator circuit.

Referring now to the figures of the drawing in detail and first, particularly, to FIG. 1 thereof, there is seen a basic cell of a comparator, which may include two emitter-coupled p-n-p transistors T1 and T2 having two input signals E1 and E2 applied at the bases thereof in the form of voltages that occur with respect to a reference potential. A current mirror has two n-p-n transistors T3 and T4 with a base point which is connected to a negative pole V− of a supply voltage source, and an input and output which are each connected to the collector of a respective one of the two transistors T1 and T2. An n-p-n transistor T5 has its base connected to the output of the current mirror and its emitter connected to the negative or first pole V− of the supply voltage source. Current impressing means Q1 are connected between a positive or second pole V+ of the supply voltage source and coupled emitters of the transistors T1 and T2. The switching state of the collector of the transistor T5, which is optionally coupled to further switch elements like the bases of the transistors T1 and T2, represents the outcome of the comparison in the form of an output signal A1. A current I1 impressed by the current impressing means Q1 is substantially constant and independent of temperature.

Due to the finite slope of the transistors T1 and T2, the transition of the transistor T1 from the conducting state to the blocking state, in the range in which the voltages of the input signals E1 and E2 are approximately equal, is fluid. A load is therefore required at the base of the transistor T5, which then allows a voltage at the level of the typical base-to-emitter threshold voltage at the base of the transistor T5 whenever the collector current of the transistor T2 is higher than the collector current of the transistor T1. A current mirror is typically used as such a load in comparator circuits, as mentioned above.

Figure 2:
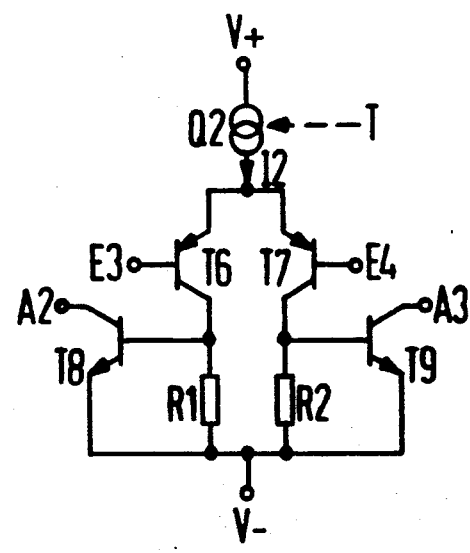
FIG. 2 is a circuit diagram of a general embodiment of a comparator circuit according to the invention.

In the exemplary embodiment of FIG. 2, the comparator circuit according to the invention has first and second emitter-coupled p-n-p transistors T6 and T7 of one conduction type. An input signal E3 is applied to the base of the transistor T6, and an input signal E4 is applied to the base of the transistor T7. Both input signals E3, E4 are voltages. The collectors of both transistors T6 and T7 are each connected through a respective second and first resistor R1 and R2 to the negative pole V− of a supply voltage source which is not shown in detail in the drawing. The two resistors R1 and R2 are identical in structure, so that they have the same resistance and the same temperature response. The base-to-emitter paths of second and first n-p-n transistors T8 and T9 of another conduction type are each connected parallel to a respective one of the resistors R1 and R2. The switching state of the transistors T8 and T9, representing the outcome of a comparison, can be picked up in the form of respective signals A2 and A3 at the collector of the applicable transistor. The coupled emitters of the transistors T6 and T7 are connected through current impressing means Q2 to the positive pole V+ of the supply voltage source. The value of a current I2 impressed by the current impressing means Q2, and its dependency on a temperature T, will be discussed in further detail elsewhere herein.

Figure 3:
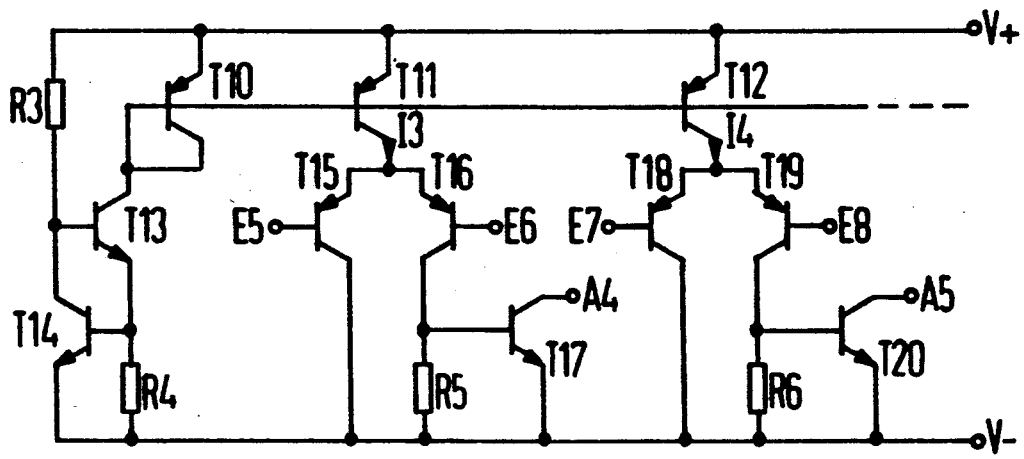
FIG. 3 is a circuit diagram of an embodiment of the invention with a plurality of comparator circuits and having a preferred embodiment of current impressing means.

The exemplary embodiment of FIG. 3 has a plurality of comparators, although only two of them are shown in the drawing. Each comparator has first and second emitter-coupled p-n-p transistors T15, T16; T18, T19 of the one conduction type having respective input signals E5–E8 applied to the bases thereof. Resistors R5; R6 are each connected in parallel with the base-to-emitter path of a respective first n-p-n transistor T17; T20 of the other conduction type. The resistors R5; R6 are each incorporated in the collector leads of a respective one of the transistors T16; T19. The emitters of the transistors T17; T20, like the collectors of the other transistors T15; T18 of the emitter-coupled transistors, are connected to the negative or first pole V− of the supply voltage source. The collectors of the transistors T17; T20 carry output signals A4 and A5. The coupled emitters of the transistors T15, T16; T18, T19 are each connected to the positive or second pole V+ of the supply voltage source through the emitter-to-collector path of a respective third p-n-p transistor T11 of the one conduction type; or additional p-n-p transistor T12 of the one conduction type. The coupled bases of the transistors T11; T12 are connected to the cathode of a diode leading to the positive pole V+ of the supply voltage. In the present exemplary embodiment, the diode is constructed as a p-n-p transistor T10 having an interconnected base and collector. The cathode of this diode is also connected to the negative pole V− of the supply voltage source through the collector-to-emitter path of a third or other n-p-n transistor T13 of the other conduction type and a third or other resistor R4. Connected parallel to the resistor R4 is the base-to-emitter path of a fourth or further n-p-n transistor T14 of the other conduction type. The collector of the transistor T14 is connected to the base of the transistor T13 and to a fourth or further resistor R3 leading to the positive pole V+ of the supply voltage source. The base-to-emitter paths of further non-illustrated p-n-p transistors, which form current impressing means for further comparators, are connected parallel to the diode provided by the transistor T10. All of the comparators are identical in structure to one another, and all of the current impressing means are identical to one another. However, a layout in which these elements differ from one another in structure is equally possible. However, in that case an adaptation would be necessary, for instance through the transistors forming the current impressing means.

The operation of a comparator circuit according to the invention is based on the following thoughts: As its load, a very simple comparator uses merely an ohmic resistor, instead of a current mirror, between the emitter and base of the output switching transistor, which in the present exemplary embodiment, for example, is represented by the transistors T8, T9, T17, T20. In order for the comparator to switch if the input signal voltages are equal, the load resistor, which in the present exemplary embodiment is represented by the resistors R1, R2, R5, R6, must be dimensioned in such a way (taking into account the fact that in this case the collector currents of the two emitter-coupled transistors are each equal to one-half the current impressed by the current impressing means) that the applicable load resistance is equal to the emitter-to-base threshold voltage of the applicable output switching transistor, divided by half the impressed current. Since the emitter-to-base threshold voltage of a transistor decreases with increasing temperature, but resistors in integrated circuits have a positive temperature coefficient, or in other words they exhibit increasing resistance with increasing temperature, the switching threshold of such a simple comparator would be very highly temperature-dependent. According to the invention, the impressed current of the comparators, which in the exemplary embodiment is represented by the current I2 and collector currents I3 and I4 of the transistors T11 and T12, are guided or controlled with the temperature, in such a way that the comparator switches independently of temperature when the input signal voltages are equal. According to the invention, the impressed current is therefore equal to twice the quotient of the temperature-dependent emitter-to-base threshold voltage of the output switching transistor and the temperature-dependent load resistor and exhibits the same temperature dependency. When structuring the current impressing means, identical temperature performance for identically constructed transistors and identically constructed resistors can be assumed, in a good approximation. In the case of the embodiment of temperature-dependent current impressing means that are based thereon and shown in FIG. 3, the result for the resistor R4 is a resistance that is equal to half the resistance of the load resistor, that is the resistance of the resistor R5 or R6. This one-half resistance can easily be attained, such as through the parallel connection of two resistors that are constructed identically to the load resistor (that is, the resistor R5 or R6).

The expenditure for circuitry is substantially less in a comparator circuit according to the invention than in known comparator circuits. Replacing the current mirror, which always requires two transistor structures, with an easily produced, low-cost resistor in the integrated circuit, substantially reduces the amount of space required in the integrated circuit, especially since the cost for the temperature-dependent current impressing means is not increased as compared with the conventional temperature-independent current impressing means previously used.

I claim:

1. A comparator circuit, comprising:

first and second transistors of one conductivity type having bases receiving input signals, collectors with leads being connected to a first pole of a supply voltage source, and coupled emitters;

a resistor connected into the collector lead of one of said first and second transistors of the one conductivity type;

a transistor of another conductivity type having a base-to-emitter path connected parallel to said resistor and a collector issuing an output signal; and current impressing means connected between the coupled emitters of said first and second transistors of the one conductivity type and a second pole of the supply voltage source, said current impressing means impressing a current at every operating temperature being equal to twice the quotient of the base-to-emitter voltage of said transistor of the other conductivity type and said resistor;

wherein said resistor is a first resistor, said transistor of the other conductivity type is a first transistor of the other conductivity type, and including:

a second resistor having the same resistance and the same temperature response as said first resistor and being connected into the collector lead of the other of said first and second transistors of the one conductivity type; and a second transistor of the other conductivity type having the same base-to-emitter voltage and the same temperature response as said first transistor of the other conductivity type, having a base-to-emitter path connected parallel to the second resistor, and having a collector issuing another output signal.

2. The comparator circuit of claim 1, wherein:

said current impressing means are in the form of a third transistor of the one conductivity type having an emitter connected to the second pole of the supply voltage, a collector connected to the coupled emitters of said first and second transistors of the one conductivity type, and a base; and including:

a diode connected in the conducting direction between the base of said third transistor of the one conductivity type and the second pole of the supply voltage source;

a third transistor of the other conductivity type having a base and having a collector-to-emitter path connected to the base of said third transistor of the one conductivity type, and a third resistor connected between the collector-to-emitter path of said third transistor of the other conductivity type and the first pole of the supply voltage source;

a fourth resistor connected between the base of said third transistor of the other conductivity type and the second pole of the supply voltage source, and a fourth transistor of the other conductivity type having a collector-to-emitter path connected between the base of said third transistor of the other conductivity type and the first pole of the supply voltage source;

said fourth transistor of the other conductivity type having a base-to-emitter path connected parallel to said third resistor.

3. A comparator circuit, comprising:

first and second transistors of one conductivity type having bases receiving input signals, collectors with leads being connected to a first pole of a supply voltage source, and coupled emitters;

a resistor connected into the collector lead of one of said first and second transistors of the one conductivity type;

a transistor of another conductivity type having a base-to-emitter path connected parallel to said resistor and a collector issuing an output signal; and current impressing means connected between the coupled emitters of said first and second transistors of the one conductivity type and a second pole of the supply voltage source, said current impressing means impressing a current at every operating temperature being equal to twice the quotient of the base-to-emitter voltage of said transistor of the other conductivity type and said resistor;

wherein said current impressing means are in the form of a third transistor of the one conductivity type having an emitter connected to the second pole of the supply voltage, a collector connected to the coupled emitters of said first and second transistors of the one conductivity type, and a base; and including:

a diode connected in the conducting direction between the base of said third transistor of the one conductivity type and the second pole of the supply voltage source;

another transistor of the other conductivity type having a base and having a collector-to-emitter path connected to the base of said third transistor of the one conductivity type, and another resistor connected between the collector-to-emitter path of said other transistor of the other conductivity type and the first pole of the supply voltage source;

a further resistor connected between the base of said other transistor of the other conductivity type and the second pole of the supply voltage source, and a further transistor of the other conductivity type having a collector-to-emitter path connected between the base of said other transistor of the other conductivity type and the first pole of the supply voltage source;

said further transistor of the other conductivity type having a base-to-emitter path connected parallel to said further resistor.

4. The comparator circuit of claim 3, including additional transistors of the one conductivity type having base-to-emitter paths connected parallel to the base-to-emitter path of said third transistor of the one conductivity type, said additional transistors providing current impressing means for further comparator circuits.

* * * * *